US009466780B2

(12) United States Patent
Kreiter et al.

(10) Patent No.: US 9,466,780 B2
(45) Date of Patent: Oct. 11, 2016

(54) ACTUATOR UNIT, METHOD FOR PRODUCING AN ACTUATOR UNIT, AND SLEEVE FOR ACCOMMODATING A PIEZOACTUATOR

(75) Inventors: Johann Kreiter, Deutschlandsberg (AT); Siegfried Fellner, St. Gerogen (AT)

(73) Assignee: EPCOS AG, Munich (DE)

( * ) Notice: Subject to any disclaimer, the term of this patent is extended or adjusted under 35 U.S.C. 154(b) by 493 days.

(21) Appl. No.: 13/883,268

(22) PCT Filed: Oct. 26, 2011

(86) PCT No.: PCT/EP2011/068759
§ 371 (c)(1),
(2), (4) Date: Jul. 3, 2013

(87) PCT Pub. No.: WO2012/059380
PCT Pub. Date: May 10, 2012

(65) Prior Publication Data
US 2013/0285511 A1     Oct. 31, 2013

(30) Foreign Application Priority Data
Nov. 2, 2010   (DE) .......... 10 2010 050 266

(51) Int. Cl.
*H01L 41/053*    (2006.01)
*H01L 41/23*     (2013.01)

(52) U.S. Cl.
CPC ......... *H01L 41/0533* (2013.01); *H01L 41/053* (2013.01); *H01L 41/23* (2013.01); *Y10T 29/42* (2015.01)

(58) Field of Classification Search
CPC .................. H01L 41/053; H01L 41/083
USPC .................................. 310/328, 340
See application file for complete search history.

(56) References Cited

U.S. PATENT DOCUMENTS

| 2003/0085634 | A1 | 5/2003 | Leo et al. | |
|---|---|---|---|---|
| 2007/0024160 | A1* | 2/2007 | Denzler et al. | 310/340 |
| 2010/0026144 | A1* | 2/2010 | Kastl et al. | 310/366 |
| 2011/0057548 | A1 | 3/2011 | Rinner et al. | |

FOREIGN PATENT DOCUMENTS

| DE | 197 15 487 A1 | 10/1998 |
|---|---|---|
| DE | 199 46 965 A1 | 5/2001 |
| DE | 101 33 151 A1 | 1/2003 |
| DE | 10 2004 031 404 A1 | 2/2006 |
| DE | 10 2006 025 177 A1 | 12/2007 |
| DE | 10 2007 026 137 A1 | 12/2008 |

(Continued)

*Primary Examiner* — Derek Rosenau
(74) *Attorney, Agent, or Firm* — McDermott Will & Emery LLP

(57) ABSTRACT

The invention relates to an actuator unit, which comprises a piezoactuator (1) having a first end face (14') and a second end face (13'). The actuator unit further comprises a sleeve (9) for accommodating the piezoactuator (1), wherein the sleeve (9) has a first end face (14) and a second end face (13). The actuator unit further comprises a potting compound (11) which surrounds the piezoactuator (1). The piezoactuator (1) and the potting compound (11) are introduced into the sleeve (9). The potting compound (11) extends no further than the first end face (14') of the piezoactuator (1). The invention further relates to a method for manufacturing an actuator unit and a sleeve for accommodating a piezoactuator.

10 Claims, 2 Drawing Sheets

(56) References Cited

FOREIGN PATENT DOCUMENTS

| DE | 10 2008 003 821 A1 | 7/2009 |
| DE | 10 2009 029 489 A1 | 3/2011 |
| JP | 200539199 | 2/2005 |
| JP | 2010171146 A | 8/2010 |
| JP | 2010258025 A | 11/2010 |

* cited by examiner

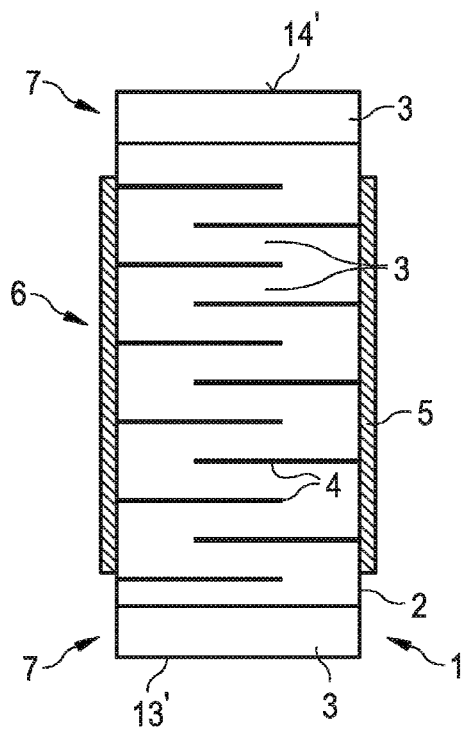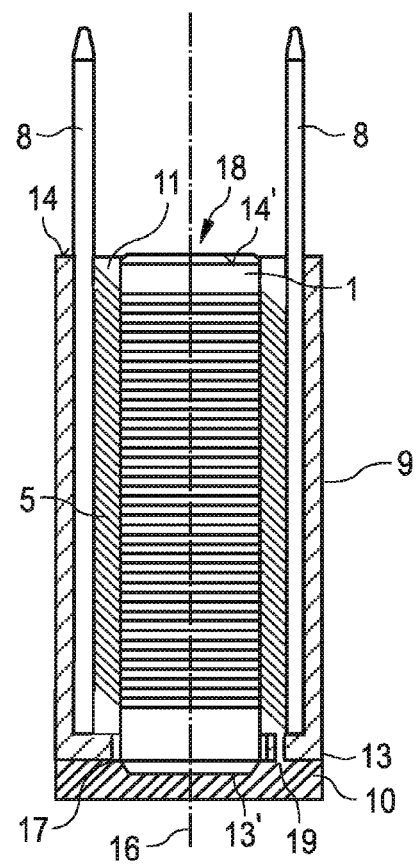

ACTUATOR UNIT, METHOD FOR PRODUCING AN ACTUATOR UNIT, AND SLEEVE FOR ACCOMMODATING A PIEZOACTUATOR

The invention relates to an actuator unit, to a method for producing an actuator unit, and to a sleeve for accommodating a piezoactuator.

Piezoactuators generally comprise a plurality of layers of a piezoelectric material. Piezoactuators can be used, for example, for actuating an injection valve in a motor vehicle. A sleeve is of significance for protecting a piezoactuator from environmental influences if the service life of the piezoactuator is to be as long as possible.

Piezoactuators are known, for example, from DE 10 2004 031 404 A1 and DE 10 2006 025 177 A1.

It is an object of the invention to specify an actuator unit and a method for producing an actuator unit and a sleeve, as a result of which the reliability and the service life of a piezoactuator are increased.

An actuator unit is specified which comprises a piezoactuator. The piezoactuator has a first end face and a second end face. Furthermore, the actuator unit comprises a sleeve for accommodating the piezoactuator. The sleeve has a first end face or end side and a second end face or end side. Furthermore, the actuator unit comprises a casting compound which surrounds the piezoactuator. The piezoactuator and the casting compound are inserted into the sleeve. The casting compound reaches at most as far as the first end face of the piezoactuator.

The sleeve is designed to protect the piezoactuator from environmental influences, such as high temperatures which occur, for instance, in the engine compartment of a motor vehicle. The sleeve therefore increases the service life of the piezoactuator. Furthermore, the sleeve serves for dimensional stabilization of the casting compound.

The casting compound surrounds the piezoactuator. The casting compound preferably reaches exactly as far as the first end face of the piezoactuator. The first end face of the piezoactuator is arranged closer to the first end face or end side of the sleeve than the second end face of the piezoactuator. In one preferred embodiment, the casting compound terminates flushly with the first end face of the piezoactuator. A projecting of the casting compound beyond the first end face of the piezoactuator, as a result of which, for example, connection elements of the piezoactuator could be contaminated and therefore external connection of the piezoactuator could be made more difficult, is avoided.

In one advantageous embodiment, the first end face of the piezoactuator and the first end face or end side of the sleeve have the same axial position in relation to the main axis of the actuator unit.

The height or length of the sleeve advantageously corresponds approximately to the height of the piezoactuator. As a result, it can be achieved that the casting compound terminates flushly with the first end face of the piezoactuator and at the same time with the first end face or end side of the sleeve. As a result, the stability and the service life of the actuator unit are increased. Furthermore, automatic production of the actuator unit can be facilitated, since the casting compound is always filled up to a defined level, for example as far as the first end face or end side of the sleeve and of the piezoactuator. Production costs can be reduced in this way.

In one embodiment of the actuator unit, the sleeve is configured in one piece.

Automatic production of the actuator unit can be facilitated further by a single-piece sleeve. Escaping of the casting compound at connecting points of different sleeve parts can be avoided. An actuator unit can therefore be achieved which can be produced simply and is inexpensive. Furthermore, tilting of the piezoactuator at connecting points of a plurality of sleeve parts during the insertion of the piezoactuator can be avoided by the single-piece embodiment of the sleeve.

In one embodiment of the actuator unit, the second end face or end side of the sleeve comprises an aperture. The second end face of the piezoactuator is inserted into the aperture.

The aperture preferably has the shape of a square. The aperture has a dimension which corresponds approximately to the dimension of the second end face of the piezoactuator. The dimension of the second end face of the piezoactuator is preferably smaller than or at most equal to the dimension of the aperture, with the result that the second end face of the piezoactuator can be inserted easily into the aperture.

In one embodiment of the actuator unit, the second end face of the piezoactuator is inserted into the aperture in such a way that the second end face of the piezoactuator protrudes out of the second end face or end side of the sleeve.

In one embodiment of the actuator unit, the first end face or end side of the sleeve has an opening. The opening is suitable for the insertion of the piezoactuator into the sleeve.

The sleeve preferably has the shape of a cylinder. The first end face or end side of the sleeve is open, with the result that the piezoactuator can be inserted into the sleeve through the opening. The second end face or end side of the sleeve forms the bottom of the sleeve, the bottom having the above-described aperture for accommodating the second end face of the piezoactuator.

In one embodiment of the actuator unit, the material of the sleeve comprises PBT.

The sleeve preferably contains a material comprising a thermoplastic polyester, for example, polybutylene terephthalate (PBT). Said material has hydrophobic properties. At the same time, said material imparts mechanical strength or stability which is sufficient for the dimensional stabilization of the casting compound. Furthermore, said material is resistant to temperatures. Moreover, PBT has the advantage that, on account of its chemical stability, the material does not secrete with respect to the piezoactuator and contaminate the latter chemically. The material of the sleeve preferably enters into a connection with the casting compound, as a result of which cavities between the casting compound and the sleeve are largely avoided.

In one embodiment of the actuator unit, the piezoactuator comprises a stack of piezoceramic layers and comprises electrode layers which are arranged between the piezoceramic layers. The electrode layers are connected with opposing poles.

For example, the piezoceramic layers have a lead zirconate titanate (PZT) ceramic. The electrode layers preferably contain one of the following materials: silver, palladium, platinum, copper, nickel. When a voltage is applied to the electrode layers, a deformation of the piezoceramic material occurs. This deformation can also be called a piezoelectric stroke.

In one embodiment of the actuator unit, the piezoactuator has two connection elements. The connection elements protrude beyond the first end face of the piezoactuator.

The connection elements serve for the external connection of the actuator unit. Preferably, on two side faces of the stack respectively one connection element is attached. The connection elements can be embodied as pins.

In one embodiment of the actuator unit, that part region of the connection elements which protrudes beyond the first end face of the piezoactuator is free of casting compound.

Since the casting compound reaches at most as far as the first end face of the piezoactuator, the connection elements which protrude beyond the first end face of the piezoactuator can be kept free of casting compound. Complicated cleaning of the connection elements therefore becomes superfluous. Automatic production of the actuator unit is aided as a result. Furthermore, the service life of the actuator unit can therefore be increased, since the connection elements are kept free of contaminants by the casting compound.

Furthermore, a method is specified for producing the above-described actuator unit. Here, the piezoactuator is inserted into the sleeve in a first step. The casting compound is inserted into the sleeve in a second step. The casting compound serves to fill a cavity between the inner side of the sleeve and the piezoactuator. The cavity is filled with the casting compound in a third step. The cavity is preferably filled in such a way that the casting compound reaches at most as far as the first end face of the piezoactuator.

The casting compound preferably terminates flushly with the first end face or end side of the sleeve and of the piezoactuator. As soon as the casting compound terminates flushly with the first end face or end side of the sleeve, the filling is stopped, with the result that the casting compound does not exceed the level of the first end face of the piezoactuator.

The casting compound can be inserted into the sleeve, for example, from the first end face or end side of the sleeve via the opening in the first end face or end side. In a further embodiment, the casting compound can be inserted from the side of the second end face or end side of the sleeve. For this purpose, the second end face or end side can have an opening, for example a hole, via which a filling element can be inserted into the sleeve.

The cavity is preferably filled in such a way that turbulences in the casting compound which lead, for example, to air inclusions in the casting compound are avoided. This can be achieved, for example, by very slow filling or else by special guidance of the filling element. For example, the filling element can always be held just above the casting compound level during filling.

In one embodiment, furthermore, the method has the step of the attachment of a sealing element on the second end face or end side of the sleeve before filling of the cavity. The sealing element is preferably attached releasably on the second end face or end side of the sleeve. The sealing element serves to seal the second end face or end side of the sleeve. The sealing element is attached on the second end face or end side of the sleeve in such a way that escaping of the casting compound from the side of the second end face or end side of the sleeve during filling of the cavity is prevented.

On account of production tolerances, a gap can occur between the aperture on the second end side of the sleeve and the piezoactuator. Casting compound can escape through said gap during sealing of the actuator unit. The sealing element seals the second end face or end side of the sleeve against escaping of the casting compound.

In one embodiment, furthermore, the method has the step of hardening of the casting compound. In a last step, the sealing element is removed from the second end face or end side of the sleeve after the hardening operation.

After the hardening of the casting compound, escaping of the casting compound from the side of the second end face or end side of the sleeve is no longer possible. The sealing element on the second end face or end side of the sleeve therefore becomes superfluous and can be removed. Since the sealing element is attached, for example pressed, releasably on the second end face or end side of the sleeve, this can take place in an automated step without great additional outlay.

Furthermore, a sleeve for accommodating a piezoactuator is specified. The sleeve is configured in one piece.

The sleeve can be, for example, injection molded.

The described subjects will be explained in greater detail using the following exemplary embodiments. In the drawing:

FIG. 1 shows a diagrammatic illustration of a piezoactuator,

FIG. 2 shows a diagrammatic illustration of an actuator unit,

Figure 3:
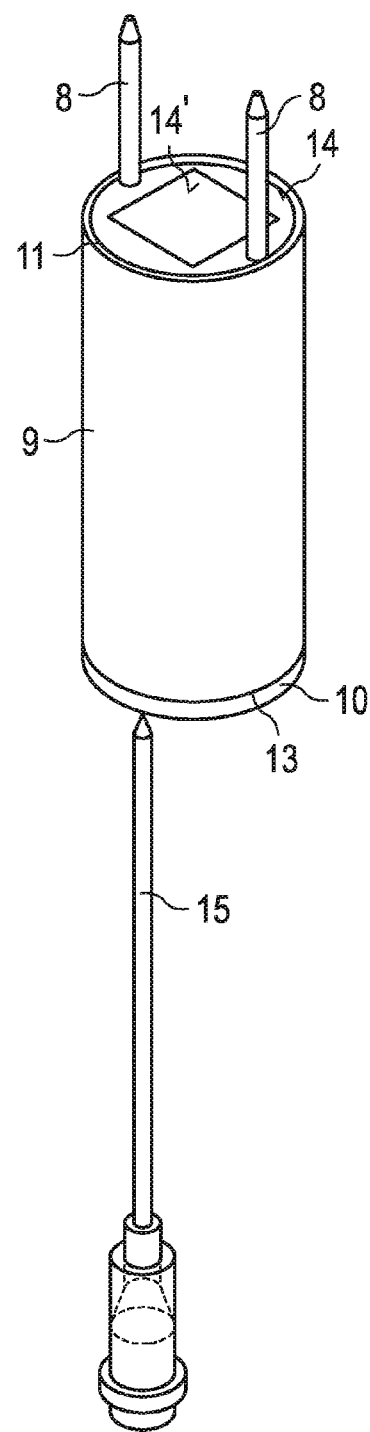
FIG. 3 shows a diagrammatic illustration of the actuator unit from FIG. 2 during the sealing.

In the exemplary embodiments and figures, identical or identically acting constituent parts can be provided in each case with the same designations. The elements which are shown and their proportions with respect to one another are in principle not to be considered true to scale, but rather individual elements, such as layers, components, structural elements and regions, can be shown with exaggerated thickness or large dimensions for improved illustration capabilities and/or for improved understanding.

FIG. 1 shows a multiple-layer piezoactuator 1. The piezoactuator 1 has a stack 2 of a plurality of piezoelectric layers 3 which are arranged above one another. The piezoactuator 1 has a first end face 14' and a second end face 13'.

The stack 2 is divided along the stack direction into an active region 6 and two inactive regions 7. The inactive regions 7 adjoin the active region 6 in the stack direction and form the end pieces of the stack 2. The active region 6 of the stack 2 has electrode layers 4 which are arranged between the piezoelectric layers 3. In order to make it possible to connect the electrode layers 4 simply in the active region 6, the piezoactuator 1 is configured in such a way that only electrode layers 4 which are assigned in each case to the same electric polarity extend as far as an edge region of the piezoactuator 1. The electrode layers 4 which are assigned to the other electric polarity do not extend at this point quite as far as the edge of the piezoactuator 1. Accordingly, the electrode layers 4 are configured in each case in the form of combs which are pushed into one another. An electric voltage can be applied to the electrode layers 4 via contact faces in the form of metalizations 5 on the outer side of the stack 2. When a voltage is applied to the electrode layers 4, a deformation of the piezoelectric material occurs in the active region 6.

The metalizations 5 are connected in each case to a connection element 8 (see FIGS. 2 to 4) which is embodied as a wire or pin and makes electric connection of the piezoactuator 1 to the outside possible.

FIG. 2 shows a diagrammatic illustration of an actuator unit.

The actuator unit has a sleeve 9. The sleeve 9 is of cylindrical configuration. The sleeve 9 is composed, for example, of polybutylene terephthalate (PBT). The sleeve 9 is configured as one piece. The sleeve 9 has a first end face or end side 14 and a second end face or end side 13. The piezoactuator 1 from FIG. 1 is arranged in the sleeve 9. The piezoactuator 1 is arranged in the sleeve 9, in particular, in such a way that the first end face 14' of the piezoactuator 1 is arranged closer to the first end face or end side 14 of the sleeve 9 than the second end face 13' of the piezoactuator 1.

The first end face or end side 14 of the sleeve 9 has an opening 18. The opening 18 is designed for receiving the piezoactuator 1 into the interior of the sleeve 9. The height or length of the sleeve 9 corresponds approximately to the height of the piezoactuator 1. In this exemplary embodiment, the first end face 14' of the piezoactuator 1 terminates flushly with the first end face or end side 14 of the sleeve. As a result, the first end face 14' of the piezoactuator 1 and the first end face or end side 14 of the sleeve have the same axial position in relation to the main axis 16 of the actuator unit or of the sleeve 9, the main axis 16 extending between the first end face or end side 14 and the second end face or end side 13 of the sleeve 9. The connection elements 8 of the piezoactuator 1 protrude beyond the first end face 14' of the piezoactuator 1 and, as a result, also out of the first end face or end side 14 of the sleeve 9.

The second end face or end side 13 of the sleeve 9 forms the bottom of the sleeve 9. The second end face or end side 13 has an aperture 17. The aperture is a square aperture. The main axis 16 runs through the opening 17. The second end face 13' of the piezoactuator 1 is inserted into the opening 17 or is guided through the latter. The second end face 13' of the piezoactuator 1 protrudes out of the opening 17 and therefore beyond the second end face or end side 13 of the sleeve 9.

A clearance or a gap (not shown explicitly) can occur between the opening 17 and the piezoactuator 1 on account of production tolerances. Sealing material 1 can escape through said clearance during the sealing of the actuator unit. In order to prevent escaping of the casting compound 11 from the opening 17 and, as a result, from the side of the second end face or end side 13 of the sleeve 9, a sealing element 10 is attached on the second end face or end side 13 of the sleeve 9. The sealing element 10 closes the second end face or end side 13 of the sleeve 9.

The sealing element 10 is pressed by machine onto the end face or end side 13 of the sleeve. The sealing element 10 is attached releasably. The sealing element 10 is attached merely during the sealing of the actuator unit and during a subsequent hardening operation of the casting compound 11, as will be explained in greater detail in conjunction with FIGS. 3 and 4.

The sealing element 10 is a sealing disk. The sealing element 10 is deformable. The sealing element 10 comprises a foam. During the attaching of the sealing element 10 to the second end face or end side 13 of the sleeve 9, the sealing element 10 is adapted to the second end face 13' of the piezoactuator 1, which second end face 13' protrudes out of the side of the second end face 13 or end side of the sleeve 9.

The casting compound 11 encloses the piezoactuator 1. The casting compound 11 comprises a silicone elastomer. In addition to silicone elastomer, the casting compound 11 may comprise a quartz sand and adhesion-promoting materials. The casting compound 11 is connected to the outer side of the piezoactuator 1, that is to say both to outer faces of the piezoceramic layers 3 and to the outer faces of the metalizations 5 and the connection elements 8. The casting compound 11 is delimited to the outside by the sleeve 9. In this exemplary embodiment, the casting compound 11 is filled up to the level. The casting compound 1 terminates flushly with the first side face 14' of the piezoactuator 1 and, as a result, with the first side face 14 of the sleeve 9. In a further exemplary embodiment, the casting compound 11 can also reach as far as just below the first end face 14' of the piezoactuator 1. In every case, the casting compound 11 does not exceed the level of the first end face 14' of the piezoactuator 1. In particular, that region of the connection elements 8 which protrudes beyond the first end face 14' of the piezoactuator 1 is free of casting compound 11. Complicated cleaning operations of the connection elements 8 after the sealing of the actuator unit are dispensed with as a result. An automatic production process of the actuator unit is therefore facilitated.

Figure 4:
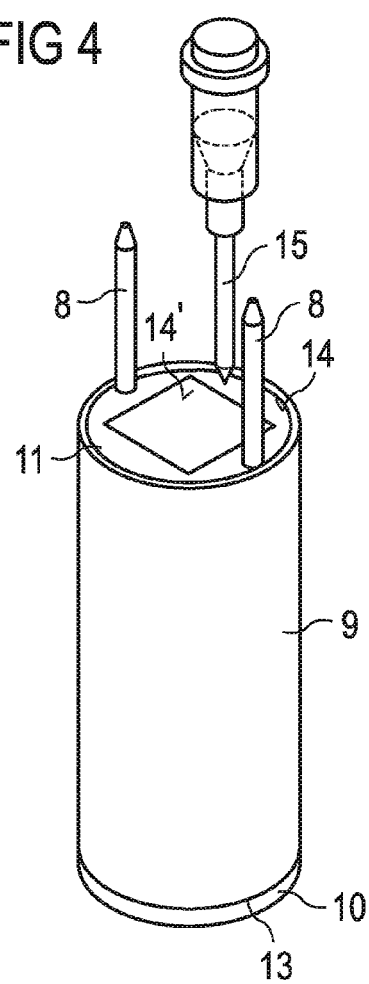
FIG. 4 shows a diagrammatic illustration of the actuator unit from FIG. 2 during the sealing in a further embodiment.

FIGS. 3 and 4 show the described actuator unit during its production, in particular during the sealing.

In a first production step of the actuator unit, the piezoactuator 1 is inserted via the opening 18 into the sleeve 9, with the result that the second end face 13' of the piezoactuator 1 protrudes beyond the aperture 17 out of the second end face or end side 13 of the sleeve 9. The first end face 14' of the piezoactuator 1 is flush with the first end face or end side 14 of the sleeve 9, as has been described in conjunction with FIG. 2.

In a next step, the above-described sealing element 10 is attached on the second end face or end side 13 of the sleeve 9 in such a way that the second end face or end side 13 is sealed against escaping of the casting compound 11 during the sealing.

In a further step, the casting compound 11 is inserted into the sleeve 9, in order to fill the cavity between the inner side of the sleeve 9 and the piezoactuator 1. The insertion of the casting compound 11 takes place via a filling element 15. The filling element 15 is a needle.

In a further step, the cavity is filled with the casting compound in such a way that the casting compound terminates flushly with the first end face 14' of the piezoactuator 1. Here, the filling can take place from the side of the first end face or end side 14 of the sleeve 9 (see FIG. 4). Here, the filling element 15 is guided from the side of the first end face or end side 14 of the sleeve 9 into the cavity as far as close to the second end face or end side 13. During the filling of the cavity, the filling element 15 is moved in the direction of the first end face or end side 14 (not shown explicitly), the filling element 15, in particular a filling opening of the filling element 15, always being held just above the casting compound level, in order to make uniform filling possible and to avoid turbulences which can lead to air inclusions in the casting compound 11.

The filling can also take place from the side of the second end face or end side 13 of the sleeve 9 (see FIG. 3). Here, the filling element 15 is inserted into the cavity from the side of the second end face or end side 14 of the sleeve 9. For this type of filling, the sleeve 9, in particular the second end face or end side 13 of the sleeve 9, has a further opening 19 (see FIG. 2), via which the filling element 15 is inserted into the cavity. The opening 19 is offset radially with respect to the aperture 17 with regard to the main axis 16. During the insertion of the filling element 15 into the cavity via the opening 19, the sealing element 10 is pierced by the filling element 15. Since the sealing element 10 is composed of a flexible material, for example foam, the piercing opening is closed again automatically, as a result of which no escaping of the casting compound 11 through the piercing opening occurs.

After the filling of the cavity, the filling element 15 is removed. In a next step, the casting compound 11 is hardened. After the hardening of the casting compound 11, the sealing element 10 is removed from the second end face or end side 13 of the sleeve 9.

LIST OF DESIGNATIONS

1 Piezoactuator
2 Stack
3 Piezoelectric layer
4 Electrode layer
5 Metalization
6 Active region
7 Inactive region
8 Connection element
9 Sleeve
10 Sealing element
11 Casting compound
13 End face or end side
14 End face or end side
13' End face
14' End face
15 Filling element
16 Main axis
17 Aperture
18 Opening
19 Opening

The invention claimed is:

1. An actuator unit comprising:
a piezoactuator having a first end face and a second end face;
a sleeve for accommodating the piezoactuator, the sleeve having a first end face or end side and a second end face or end side; and
a casting compound which surrounds the piezoactuator, the piezoactuator and the casting compound being inserted into the sleeve, and the casting compound reaching at most as far as the first end face of the piezoactuator,
wherein the first end face or end side of the sleeve is open and suitable for the insertion of the piezoactuator into the sleeve,
wherein the second end face or end side of the sleeve forms the bottom of the sleeve being formed differently in comparison to the first end face or end side and comprising an aperture,
wherein the second end face of the piezoactuator is inserted into the aperture in such a way that the second end face of the piezoactuator protrudes out of the second end face or end side of the sleeve,
wherein the piezoactuator comprises two connection elements, a portion of the connection elements protruding out of and beyond the first end face of the piezoactuator, and
wherein the casting compound terminates flushly with the first end face of the piezoactuator.

2. The actuator unit according to claim 1, wherein the casting compound terminates flushly with the first end face of the piezoactuator, and
wherein the first end face of the piezoactuator is arranged closer to the first end face or end side of the sleeve than the second end face of the piezoactuator.

3. The actuator unit according to claim 1 or, wherein the first end face of the piezoactuator and the first end face or end side of the sleeve have the same axial position in relation to the main axis of the actuator unit.

4. The actuator unit according to claim 1, wherein the sleeve is configured as one piece.

5. The actuator unit according to claim 1, wherein the material of the sleeve comprises PBT.

6. The actuator unit according to claim 1, wherein the piezoactuator comprises a stack of piezoceramic layers and electrode layers which are arranged between the piezoceramic layers, and
wherein the electrode layers are connected with opposing poles.

7. The actuator unit according to claim 1, wherein the portion of the connection elements which protrudes beyond the first end face of the piezoactuator is free of casting compound.

8. A method for producing an actuator unit according to claim 1, comprising the following steps:
A) insertion of the piezoactuator into the sleeve;
B) insertion of the casting compound into the sleeve in order to fill a cavity between the inner side of the sleeve and the piezoactuator; and
C) filling of the cavity with the casting compound, with the result that the casting compound reaches at most as far as the first end face of the piezoactuator.

9. The method according to claim 8, further comprising the step:
D) attachment of a sealing element on the second end face or end side of the sleeve in order to seal the second end face or end side of the sleeve before filling of the cavity, wherein the sealing element is attached on the second end face or end side of the sleeve in such a way that an escaping of the casting compound out of the aperture of the second end face or end side of the sleeve during filling of the cavity is prevented.

10. The method according to claim 9, further comprising the steps:
E) hardening of the casting compound; and
F) removal of the sealing element from the second end face or end side of the sleeve after the hardening.

* * * * *